United States Patent
Miyashita

(10) Patent No.: US 9,634,058 B2
(45) Date of Patent: Apr. 25, 2017

(54) IMAGE SENSOR AND COMPUTING SYSTEM HAVING THE SAME

(71) Applicant: Samsung Electronics Co., Ltd., Suwon-si (KR)

(72) Inventor: Naoyuki Miyashita, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 243 days.

(21) Appl. No.: 14/189,130

(22) Filed: Feb. 25, 2014

(65) Prior Publication Data

US 2014/0239431 A1 Aug. 28, 2014

(30) Foreign Application Priority Data

Feb. 25, 2013 (KR) ........................ 10-2013-0019597

(51) Int. Cl.
*H01L 31/0232* (2014.01)
*H01L 27/146* (2006.01)

(52) U.S. Cl.
CPC .... *H01L 27/14685* (2013.01); *H01L 27/1464* (2013.01); *H01L 27/14621* (2013.01); *H01L 27/14627* (2013.01); *H01L 27/14629* (2013.01)

(58) Field of Classification Search
CPC .................................................. H01L 31/0232
See application file for complete search history.

(56) References Cited

U.S. PATENT DOCUMENTS

| | | | |
|---|---|---|---|
| 6,969,899 B2 | 11/2005 | Yaung et al. | |
| 7,612,395 B2 | 11/2009 | Jeon | |
| 2005/0139945 A1 | 6/2005 | Lim | |
| 2008/0247060 A1 | 10/2008 | Kim | |
| 2011/0108938 A1* | 5/2011 | Nozaki | ............ H01L 27/14621 257/432 |
| 2011/0281391 A1 | 11/2011 | Itahashi | |

FOREIGN PATENT DOCUMENTS

| | | |
|---|---|---|
| JP | 2007-095791 | 4/2007 |
| JP | 2010-118477 | 5/2010 |
| KR | 10-2005-0034368 A | 4/2005 |
| KR | 10-2005-0039160 A | 4/2005 |
| KR | 10-0595898 | 6/2006 |
| KR | 10-0649020 | 11/2006 |
| KR | 10-2008-0100025 A | 11/2008 |

* cited by examiner

*Primary Examiner* — Marvin Payen
(74) *Attorney, Agent, or Firm* — Myers Bigel, P.A.

(57) ABSTRACT

An image sensor includes a light receiving element, an anti-reflection layer, a high refractive pattern, a color filter, and a micro lens. The light receiving element is formed on a semiconductor substrate to generate charges responsive to incident light. The anti-reflection layer is formed on the semiconductor substrate. The high refractive pattern is formed on the anti-reflection layer in correspondence with the light receiving element. The color filter is formed on the anti-reflection layer while covering a top surface and lateral sides of the high refractive pattern. The micro lens is formed on the color filter. The image sensor provides an image having high quality.

18 Claims, 15 Drawing Sheets

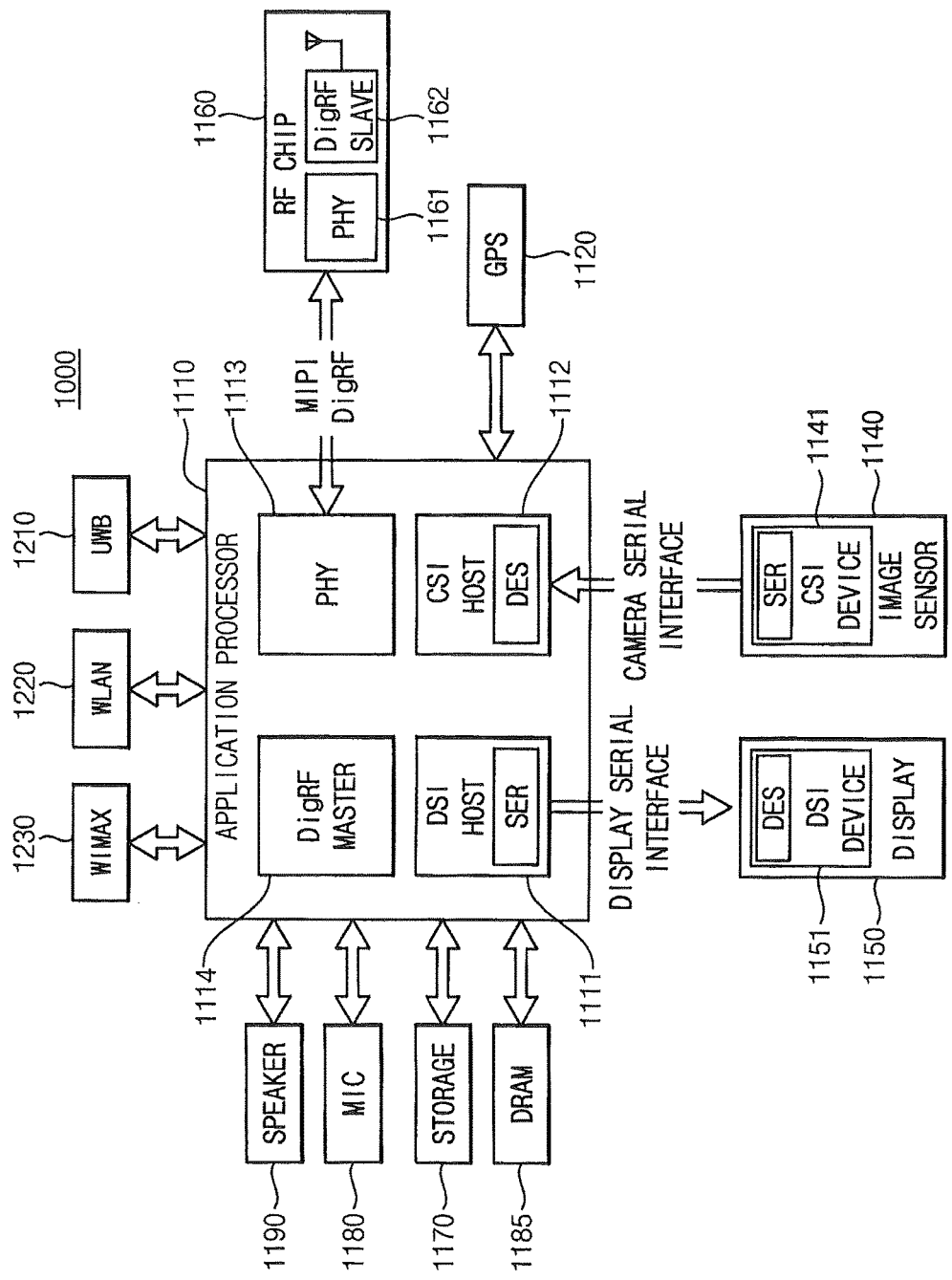

IMAGE SENSOR AND COMPUTING SYSTEM HAVING THE SAME

CROSS-REFERENCE TO RELATED APPLICATION

This application claims priority under 35 USC §119 to Korean Patent Application No. 10-2013-0019597, filed on Feb. 25, 2013, in the Korean Intellectual Property Office (KIPO), the contents of which are herein incorporated by reference in their entirety.

FIELD

Example embodiments relate generally to an image photographing technology, and more particularly to an image sensor and a computing system including the same.

BACKGROUND

As the resolution of an image sensor is increased, a size of a unit pixel included in the image sensor is gradually reduced. Thus, the quantity of light received in a light receiving element may be insufficient, so that sensitivity of the image sensor may deteriorate.

SUMMARY

Some example embodiments provide an image sensor having high sensitivity.

Some example embodiments provide a computing system including the image sensor.

According to example embodiments, an image sensor includes a light receiving element, an anti-reflection layer, a high refractive pattern, a color filter, and a micro lens. The light receiving element is formed on a semiconductor substrate to generate charges responsive to incident light. The anti-reflection layer is formed on the semiconductor substrate. The high refractive pattern is formed on the anti-reflection layer in correspondence with the light receiving element. The color filter is formed on the anti-reflection layer while covering a top surface and lateral sides of the high refractive pattern. The micro lens is formed on the color filter.

In example embodiments, the high refractive pattern may have a refractive index higher than a refractive index of the color filter.

In example embodiments, the high refractive pattern may include at least one of silicon nitride (SiN), titanium oxide ($TiO_2$), aluminum oxide ($Al_2O_3$), silicon oxynitride (SiON), aluminum nitride (AlN), tantalum oxide ($Ta_2O_3$), zirconium oxide ($ZrO_2$) and organic polymer.

In example embodiments, the micro lens may be formed by using a material identical to a material of the color filter.

In example embodiments, the image sensor may further include a conductive pattern formed under the semiconductor substrate.

In example embodiments, the image sensor may further include a conductive pattern formed between the anti-reflection layer and the color filter.

The image sensor may further include an oxide layer formed between the anti-reflection layer and the conductive pattern, and a light inducing structure that extends through the conductive pattern to make contact with the oxide layer.

The image sensor may further include a second high refractive pattern positioned under the light inducing structure and formed in the oxide layer.

The second high refractive pattern may have a refractive index higher than a refractive index of the oxide layer.

The image sensor may further include an oxide layer formed between the conductive pattern and the color filter, and a second high refractive pattern formed in the oxide layer.

The second high refractive pattern may have a refractive index higher than a refractive index of the oxide layer.

According to example embodiments, an image sensor includes a plurality of light receiving elements, an anti-reflection layer, a plurality of high refractive patterns, a plurality of first color filters, a plurality of second color filters, and a plurality of micro lenses. The plurality of light receiving elements are formed on a semiconductor substrate to generate charges corresponding to incident light. The anti-reflection layer is formed on the semiconductor substrate. The plurality of high refractive patterns are formed on the anti-reflection layer in correspondence with first light receiving elements of the plural light receiving elements. The plurality of first color filters are formed on the anti-reflection layer while covering a top surface and lateral sides of each high refractive pattern in correspondence with the first light receiving elements, respectively, to selectively allow light having a first color to pass therethrough. The plurality of second color filters are formed on the anti-reflection layer in correspondence with second light receiving elements of the plural light receiving elements, respectively, to selectively allow light having a color different from the first color to pass therethrough. The plurality of micro lenses are formed on the first and second color filters, respectively.

In example embodiments, the high refractive patterns may have a refractive index higher than a refractive index of the first color filters.

In example embodiments, the micro lenses formed on the first color filters may be prepared by using a material identical to a material of the first color filters.

In example embodiments, the first color may correspond to a blue color.

BRIEF DESCRIPTION OF THE DRAWINGS

Illustrative, non-limiting example embodiments will be more clearly understood from the following detailed description taken in conjunction with the accompanying drawings.

FIG. 21 is a block diagram illustrating an example of an interface used in the computing system of FIG. 20.

DETAILED DESCRIPTION OF THE EMBODIMENTS

Figure 1:
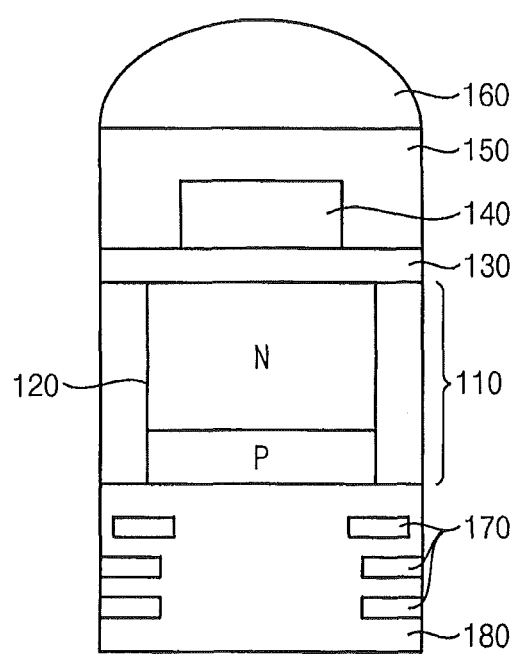
FIG. 1 is a block diagram illustrating an image sensor according to an example embodiment.

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a block diagram illustrating an image sensor according to an example embodiment.

The image sensor 100 illustrated in FIG. 1 is a back side illumination type image sensor.

One unit pixel is illustrated in FIG. 1 from among a plurality of unit pixels included in the image sensor 100.

Referring to FIG. 1, the image sensor 100 includes a light receiving element 120, an anti-reflection layer 130, a high refractive pattern 140, a color filter 150 and a micro lens 160.

As shown in FIG. 1, the light receiving element 120 is formed on a semiconductor substrate 110. The light receiving element 120 generates charges corresponding or responsive to the incident light. For instance, the light receiving element 120 illustrated in FIG. 1 is a photodiode.

The anti-reflection layer 130 is formed on the semiconductor substrate 110. The anti-reflection layer 130 prevents the incident light, which is incident through the micro lens 160, from being reflected so that quantity of light received in the light receiving element 120 may be increased.

The high refractive pattern 140 is formed on the anti-reflection layer 130 in correspondence with the light receiving element 120. The high refractive pattern 140 may include a material having a high refraction coefficient. For instance, the high refractive pattern 140 may include one of or a combination of silicon nitride (SiN), titanium oxide ($TiO_2$), aluminum oxide ($Al_2O_3$), silicon oxynitride (SiON), aluminum nitride (AlN), tantalum oxide ($Ta_2O_3$), zirconium oxide ($ZrO_2$) and organic polymer.

The color filter 150 is formed on the anti-reflection layer 130 while covering a top surface and lateral sides of the high refractive pattern 140. The color filter 150 may allow light having a specific wavelength to pass therethrough. The color filter 150 may be included in a color filter array aligned in the form of a matrix. In one example embodiment, the color filter array may have a bayer pattern including a red filter, a green filter and a blue filter. That is, the color filter 150 may be one of the red filter, the green filter and the blue filter. In another example embodiment, the color filter array may include a yellow filter, a magenta filter and a cyan filter. That is, the color filter 150 may be one of the yellow filter, the magenta filter and the cyan filter. In addition, the color filter 150 may further include a white filter.

The micro lens 160 is formed on the color filter 150 in correspondence with the light receiving element 120. The micro lens 160 can adjust a path of the incident light such that the incident light introduced into the micro lens 160 can be concentrated onto the light receiving element 120. In addition, the micro lens 160 may be included in a micro lens array aligned in the form of a matrix.

Meanwhile, an insulating interlayer 180 is formed under the semiconductor substrate 110 and a conductive pattern 170 serving as a wire may be formed on the insulating interlayer 180.

The refractive index of the high refractive pattern 140 may be higher than that of the color filter 150. Therefore, the incident light introduced through the micro lens 160 may be refracted toward the center of the light receiving element 120 by passing through the high refractive pattern 140. Thus, the high refractive pattern 140 may increase the quantity of light received in the light receiving element 120.

Figure 2A:
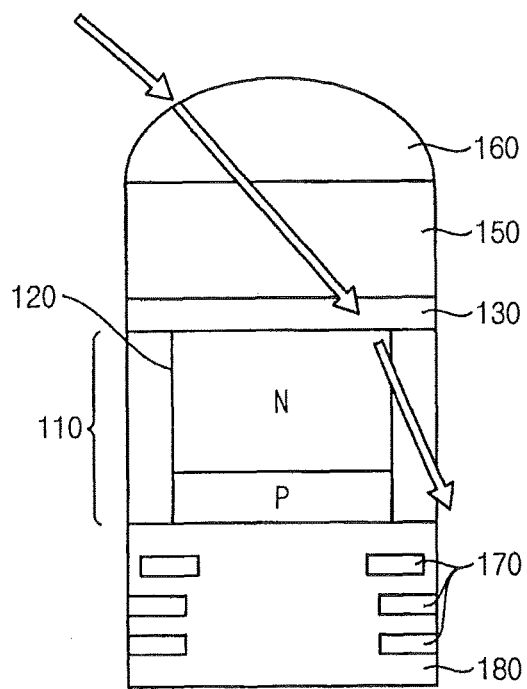
FIGS. 2A and 2B are block diagrams that illustrate operations of the image sensor illustrated in FIG. 1 according to an example embodiment.
Figure 2B:
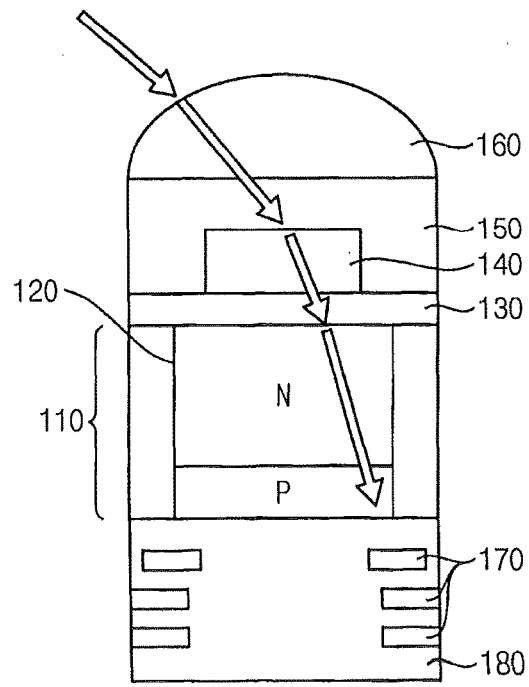

FIGS. 2A and 2B are block diagrams that illustrate operations of the image sensor illustrated in FIG. 1 according to an example embodiment.

FIG. 2A illustrates the path of the incident light passing through a typical image sensor and FIG. 2B illustrates the path of the incident light passing through the image sensor 100 shown In FIG. 1.

Referring to FIG. 2A, the incident light is refracted toward the center of the unit pixel by passing through the micro lens 160 and the anti-reflection layer 130.

As the resolution of an image sensor is increased, a size of a unit pixel included in the image sensor is gradually reduced. If the size of the unit pixel is reduced, as shown in FIG. 2A, the quantity of light received in the light receiving element 120 is reduced even if the incident light is refracted toward the center of the unit pixel while passing through the micro lens 160 and the anti-reflection layer 130.

However, the image sensor 100 according to example embodiments includes the high refractive pattern 140 having the refractive index higher than that of the color filter 150. Thus, as shown in FIG. 2B, the incident light may be more refracted toward the center of the unit pixel by passing through the high refractive pattern 140, so that the quantity of light received in the light receiving element 120 may be remarkably increased. Therefore, sensitivity of the image sensor 100 according to example embodiments can be improved, so that an image having high quality can be provided.

Figure 3A:
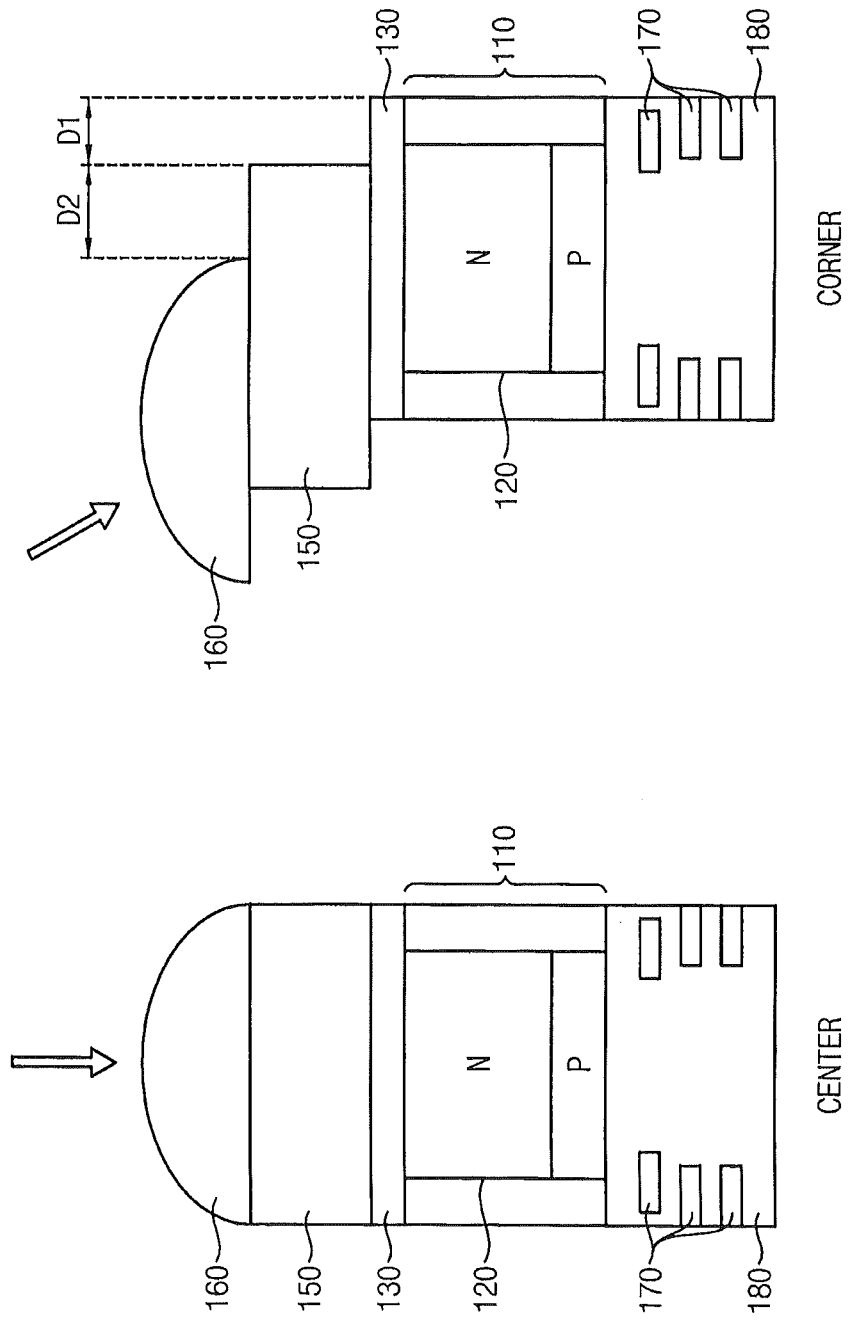
FIGS. 3A and 3B are block diagrams that illustrate further operations of the image sensor illustrated in FIG. 1 according to an example embodiment.
Figure 3B:
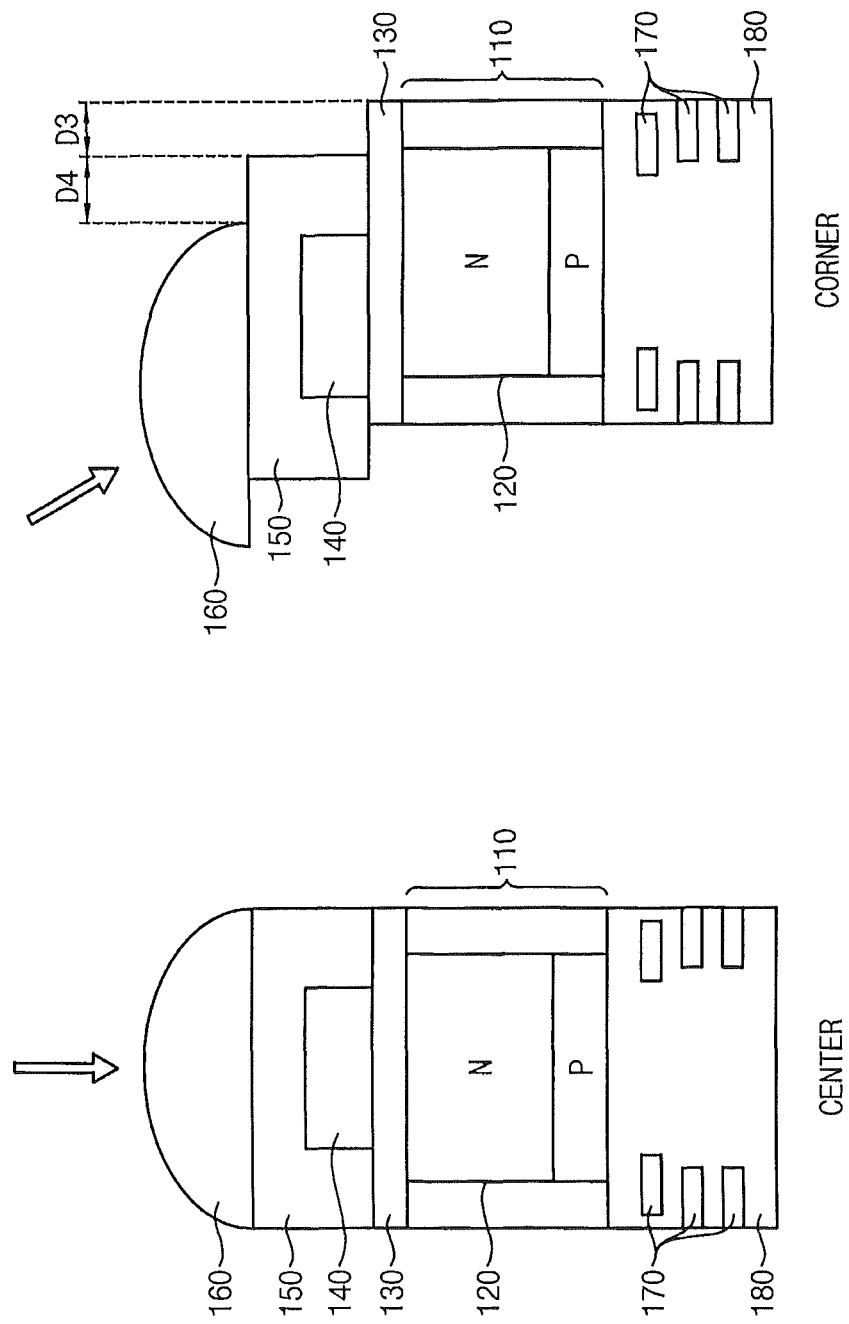

FIGS. 3A and 3B are block diagrams that illustrate further operations of the image sensor illustrated in FIG. 1 according to an embodiment.

FIG. 3A illustrates the structure of the unit pixel according to the position in the typical image sensor and FIG. 3B illustrates the structure of the unit pixel according to the position in the image sensor 100 of FIG. 1.

In general, the incident light is incident into the unit pixel located at the center of the image sensor in the direction vertical to the micro lens 160 and the incident light is incident into the unit pixel located at the corner of the image sensor in the direction inclined with respect to the micro lens 160.

Therefore, as shown in FIGS. 3A and 3B, in the typical image sensor and the image sensor 100 according to example embodiments, the light receiving element 120, the color filter 150 and the micro lens 160 are vertically aligned in the unit pixel located at the center of the image sensor.

However, as shown in FIG. 3A, in the case of the unit pixel located at the corner of the typical image sensor, the color filter 150 is shifted from the light receiving element 120 by a first distance D1 and the micro lens 160 is shifted from the color filter 150 by a second distance D2 to allow the incident light, which is slantingly incident from the micro lens 160, to reach the light receiving element 120.

In contrast, as shown in FIG. 3B, because the image sensor 100 according to example embodiments includes the high refractive pattern 140 having a refractive index higher than that of the color filter 150, in the case of the unit pixel located at the corner of the image sensor, the color filter 150 is shifted from the light receiving element 120 by a third distance D3 shorter than the first distance D1 and the micro lens 160 is shifted from the color filter 150 by a fourth distance D4 shorter than the second distance D2 to allow the incident light, which is slantingly incident from the micro lens 160, to reach the light receiving element 120.

Therefore, the installation area of the image sensor 100 according to example embodiments can be reduced and the manufacturing process for the image sensor 100 can be more simplified.

Referring again to FIG. 1, the high refractive pattern 140 is formed in the color filter 150 so that the thickness of the color filter 150 may be reduced, causing the cross-talk between unit pixels. For instance, when the color filter 150 is a blue filter, only the signal having the wavelength corresponding to the blue of the incident light may pass through the color filter 150. However, due to the high refractive pattern 140 formed in the color filter 150, the thickness of the color filter 150 may be reduced so that the signal having the wavelength corresponding to the green or the red may pass through the color filter 150 in addition to the signal having the wavelength corresponding to the blue.

In this regard, the micro lens 160 is formed of a same material used for the color filter 150. In this case, the micro lens 160 may have a same function as that of the color filter 150 so that the effect of increasing the thickness of the color filter 150 may be realized, thereby reducing the cross-talk between the unit pixels.

FIGS. 4 to 13 are sectional views to explain a method of manufacturing the image sensor illustrated in FIG. 1.

Figure 4:
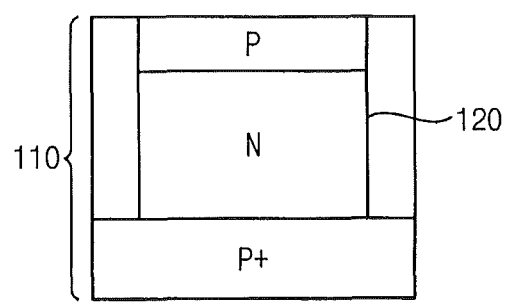
FIGS. 4 to 13 are sectional views to explain a method of manufacturing the image sensor illustrated in FIG. 1.

Referring to FIG. 4, the semiconductor substrate 110 may have a stack structure of a high-concentration P area (P+) and an epitaxial layer (P-epi). An N type impurity area is formed at a lower portion of the semiconductor substrate 110 by deeply implanting ions into the surface of the semiconductor substrate 110 and a P type impurity area is formed adjacent to the surface of the semiconductor substrate 110, thereby forming the light receiving element 120. In FIG. 4, the light receiving element 120 is a photodiode.

Figure 5:
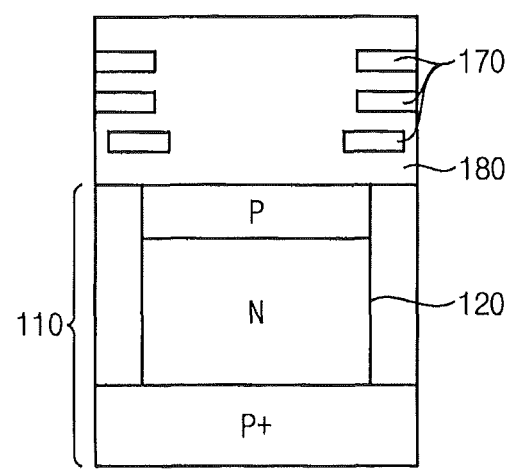

Referring to FIG. 5, the insulating interlayer 180 and the conductive pattern 170 serving as a wire may be sequentially formed on the top surface of the semiconductor substrate 110. For instance, a process of forming the insulating interlayer 180, a planarization process and a process of forming the conductive pattern 170 may be repeatedly performed on the semiconductor substrate 110.

Figure 6:
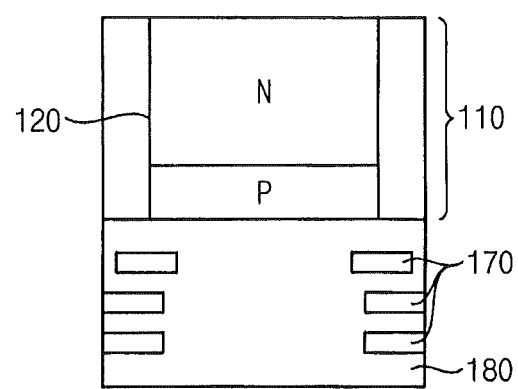

Referring to FIG. 6, the semiconductor substrate 110 is turned over such that the top surface of the semiconductor substrate 110 may be located at the bottom of the semiconductor substrate 110 to process the bottom surface of the semiconductor substrate. Then, a back-lap process may be performed on the bottom surface of the semiconductor substrate 110 to adjust the thickness of the semiconductor substrate 110 according to the design rule of the image sensor 100.

Figure 7:
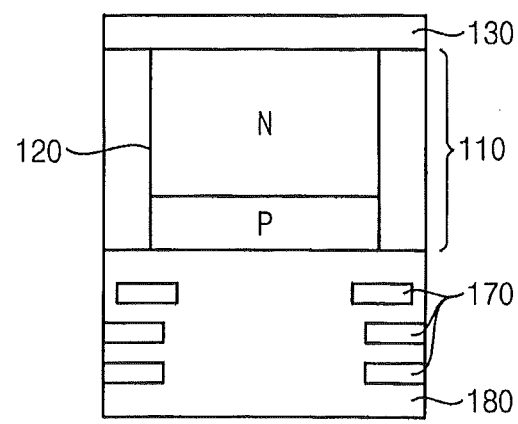

Referring to FIG. 7, the anti-reflection layer 130 may be formed on the bottom surface of the semiconductor substrate 110. The anti-reflection layer 130 may include a silicon compound or a metal compound.

Figure 8:
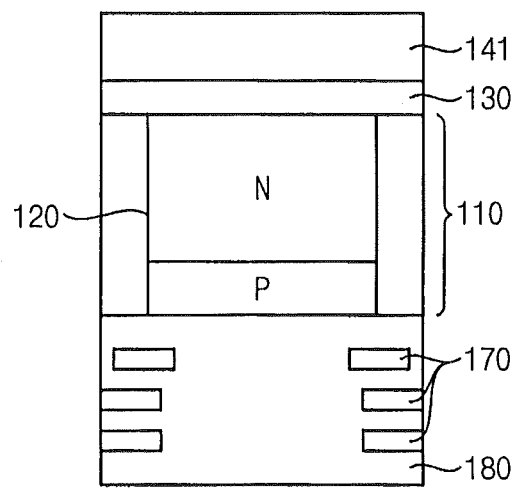

Referring to FIG. 8, the high refractive layer 141 may be formed on the anti-reflection layer 130. The high refractive layer 141 may be formed by using a material having a high refraction coefficient. For instance, the high refractive layer 141 may include one of or a combination of silicon nitride (SiN), titanium oxide ($TiO_2$), aluminum oxide ($Al_2O_3$), silicon oxynitride (SiON), aluminum nitride (AlN), tantalum oxide ($Ta_2O_3$), zirconium oxide ($ZrO_2$) and organic polymer.

Figure 9:
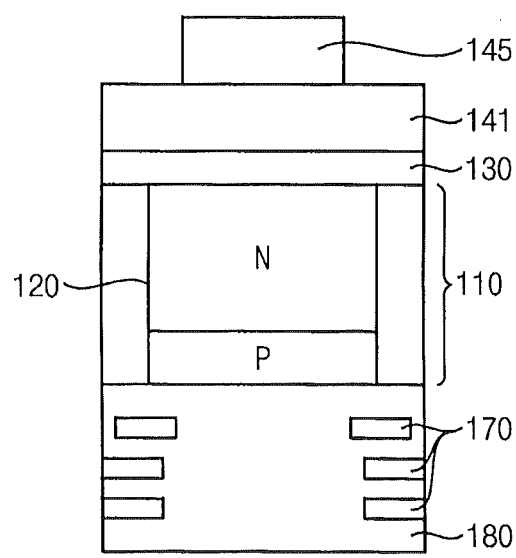

Referring to FIG. 9, a photoresist pattern 145 may be formed on the high refractive layer 141 in correspondence with the light receiving element 120. The photoresist pattern 145 may include a material having an etching rate different from an etching rate of the high refractive layer 141. For instance, the photoresist pattern 145 may include silicon nitride.

Figure 10:
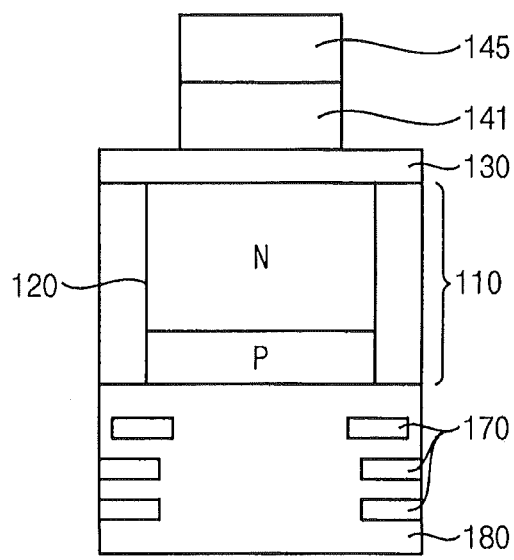
Figure 11:
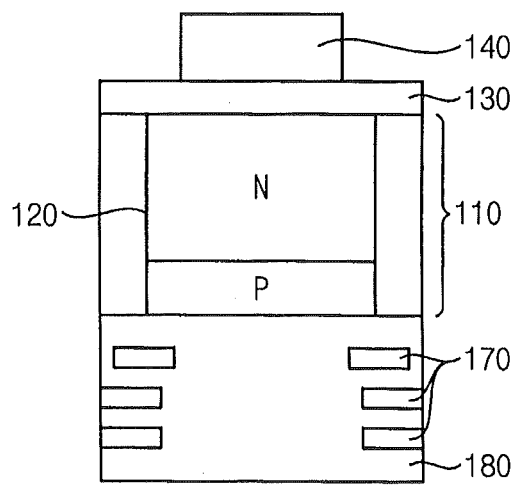

After that, as illustrated in FIG. 10, the high refractive layer 141 is patterned by performing an etching process using the photoresist pattern 145 as an etching mask and then the photoresist pattern 145 is removed so that the high refractive pattern 140 is formed on the anti-reflection layer 130 as shown in FIG. 11.

Figure 12:
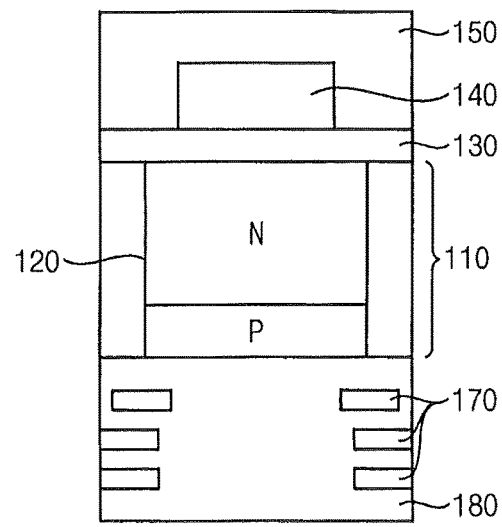
Figure 13:
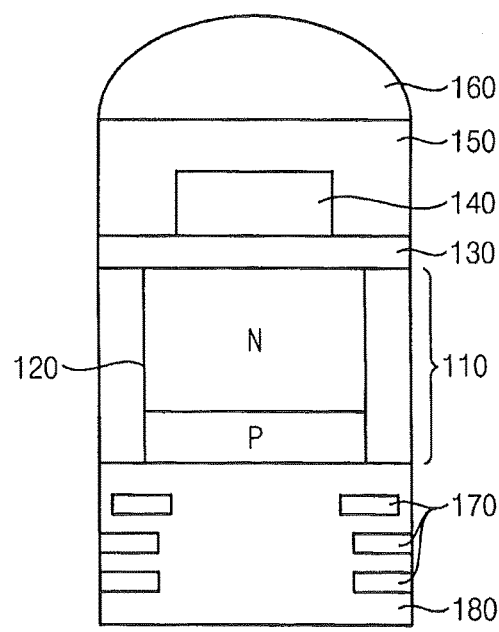

Then, as illustrated in FIG. 12, the color filter 150 is formed on the anti-reflection layer 130 to cover the top surface and lateral sides of the high refractive pattern 140 and the micro lens 160 for concentrating the incident light is formed on the color filter 150 as shown in FIG. 13, thereby manufacturing the image sensor 100.

Figure 14:
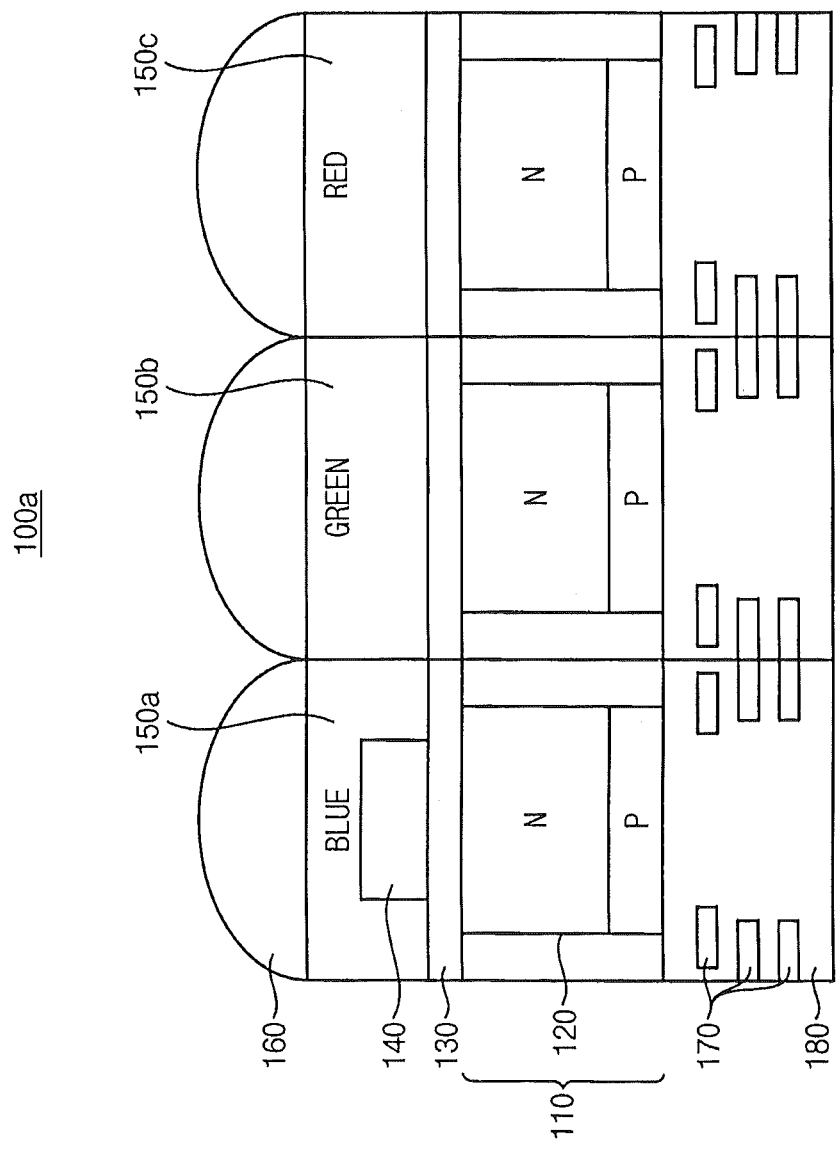
FIGS. 14 to 19 are sectional views illustrating image sensors according to other example embodiments.

FIG. 14 is a sectional view illustrating an image sensor according to another example embodiment.

The image sensor 100a of FIG. 14 is a back side illumination type image sensor.

FIG. 14 shows a plurality of unit pixels included in the image sensor 100a.

In the case of the image sensor 100 illustrated in FIG. 1, all unit pixels included in the image sensor 100 may include the high refractive pattern 140. In contrast, in the case of the image sensor 100a illustrated in FIG. 14, unit pixels including first color filters 150a corresponding to the first color may include the high refractive pattern 140 and unit pixels including second color filters 150b and 150c corresponding to colors different from the first color may not include the high refractive pattern 140.

As described above with reference to FIG. 1, the refractive index of the high refractive pattern 140 may be higher than that of the first color filter 150a. Thus, the incident light, which is incident through the micro lens 160 of the unit pixel corresponding to the first color, may be refracted to the center of the light receiving element 120 by passing through the high refractive pattern 140. Accordingly, the high refractive pattern 140 may increase the quantity of light received in the light receiving element 120.

Therefore, the image sensor 100a illustrated in FIG. 14 may selectively increase the sensitivity for specific colors, thereby adjusting the color balance.

For instance, because an optical signal corresponding to the blue has a wavelength shorter than a wavelength of an optical signal corresponding to the green or red, the transmittance of the optical signal corresponding to the blue may be lower than the transmittance of the optical signal corresponding to the green or red. Thus, the quantity of light received in the light receiving element 120 in the unit pixel corresponding to the blue may be smaller than the quantity of light received in the light receiving element 120 in the unit pixel corresponding to the green or red.

Therefore, in the case of the image sensor 100a according to example embodiments, as shown In FIG. 14, the unit pixels including the blue filter 150a include the high refractive pattern 140 and the unit pixels including the green filter 150b or the red filter 150c do not include the high refractive pattern 140, so that the sensitivity is selectively increased only for the blue color, thereby adjusting the color balance.

In addition, as described above with reference to FIG. 1, because the high refractive pattern 140 is formed in the first color filter 150a, the thickness of the first color filter 150a may be reduced so that the cross-talk may increase. To solve the above problem, the micro lens 160 formed on the first color filter 150a may be prepared by using a material the same as that of the first color filter 150a. In this case, the micro lens 160 may perform the function the same as that of the first color filter 150a, so that the effect of increasing the thickness of the first color filter 150a may be realized, thereby reducing the cross-talk of the image sensor 100a.

Although the unit pixel including the blue filter 150a, the unit pixel including the green pixel 150b and the unit pixel including the red filter 150c are sequentially aligned in FIG. 14, the example embodiments may not be limited thereto. The unit pixel including the blue filter 150a, the unit pixel including the green pixel 150b and the unit pixel including the red filter 150c may be variously aligned.

Figure 15:
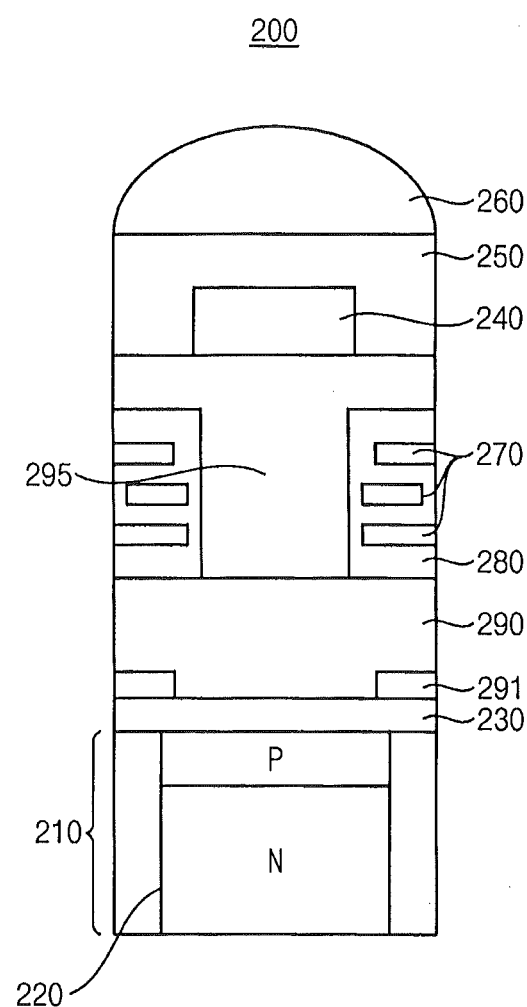

FIG. 15 is a sectional view illustrating an image sensor according to another example embodiment.

The image sensor 200 of FIG. 15 is a back side illumination type image sensor.

One unit pixel is illustrated in FIG. 15 from among a plurality of unit pixels included in the image sensor 200.

Referring to FIG. 15, the image sensor 200 includes a light receiving element 220, an anti-reflection layer 230, a high refractive pattern 240, a color filter 250 and a micro lens 260.

As shown in FIG. 15, the light receiving element 220 is formed on a semiconductor substrate 210. The light receiving element 220 generates charges corresponding to the incident light. For instance, the light receiving element 220 illustrated in FIG. 15 is a photodiode.

The anti-reflection layer 230 is formed on the semiconductor substrate 210. The anti-reflection layer 230 prevents the incident light, which is incident through the micro lens 260, from being reflected so that the quantity of light received in the light receiving element 220 may be increased.

A pad metal 291 connected to transistors and an oxide layer 290 to insulate the pad metal 291 may be formed on the anti-reflection layer 230.

An insulating interlayer 280 and a conductive pattern 270 serving as a wire are sequentially formed on the oxide layer 290.

Meanwhile, the image sensor 200 may include a light inducting structure 295 that makes contact with the oxide layer 290 by passing through the conductive pattern 270 and the insulating interlayer 280. The light inducting structure 295 may be prepared in the form of a cavity or a trench where the insulating interlayer 280 serves as a sidewall of the cavity or the trench. The light inducting structure 295 may be filled with a material having a high refractive index. The light inducting structure 295 is positioned corresponding to the light receiving element 220 to guide the incident light introduced through the micro lens 260 such that the incident light can be concentrated onto the light receiving element 220.

The high refractive pattern 240 is formed on the light inducting structure 295 in correspondence with the light receiving element 220. The high refractive pattern 240 may include a material having a high refraction coefficient. For instance, the high refractive pattern 240 may include one of or a combination of silicon nitride (SiN), titanium oxide ($TiO_2$), aluminum oxide ($Al_2O_3$), silicon oxynitride (SiON), aluminum nitride (AlN), tantalum oxide ($Ta_2O_3$), zirconium oxide ($ZrO_2$) and organic polymer.

The color filter 250 is formed on the light inducting structure 295 while covering a top surface and lateral sides of the high refractive pattern 240. The color filter 250 may allow light having a specific wavelength to pass therethrough. The color filter 250 may be included in a color filter array aligned in the form of a matrix. In one example embodiment, the color filter array may have a bayer pattern including a red filter, a green filter and a blue filter. That is, the color filter 250 may be one of the red filter, the green filter and the blue filter. In another example embodiment, the color filter array may include a yellow filter, a magenta filter and a cyan filter. That is, the color filter 250 may be one of the yellow filter, the magenta filter and the cyan filter. In addition, the color filter 250 may further include a white filter.

The micro lens 260 is formed on the color filter 250 in correspondence with the light receiving element 220. The micro lens 260 can adjust a path of the incident light such that the incident light introduced into the micro lens 260 can be concentrated onto the light receiving element 220. In addition, the micro lens 260 may be included in a micro lens array aligned in the form of a matrix.

The refractive index of the high refractive pattern 240 may be higher than that of the color filter 250. Thus, the incident light, which is incident through the micro lens 260, may be refracted to the center of the light receiving element 220 by passing through the high refractive pattern 240. Accordingly, the high refractive pattern 240 may increase the quantity of light received in the light receiving element 220.

In addition, as described above with reference to FIG. 1, because the high refractive pattern 240 is formed in the color filter 250, the thickness of the color filter 250 may be reduced so that the cross-talk may increase. To solve the above problem, the micro lens 260 formed on the color filter 250 may be prepared by using a material the same as that of the color filter 250. In this case, the micro lens 260 may perform the same function as that of the color filter 250, so that the effect of increasing the thickness of the color filter 250 may be realized, thereby reducing the cross-talk of the image sensor 200.

Figure 16:
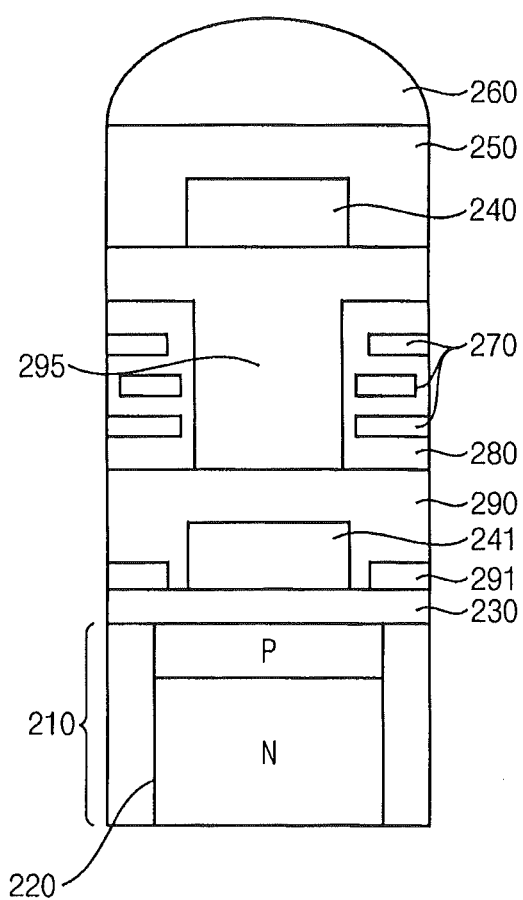

FIG. 16 is a sectional view illustrating an image sensor according to another example embodiment.

When compared with the image sensor 200 illustrated in FIG. 15, the image sensor 200a illustrated in FIG. 16 may further include a second high refractive pattern 241 positioned under the light inducing structure 295 and formed in the oxide layer 290.

The second high refractive pattern 241 may have a refractive index higher than that of the oxide layer 290. Thus, the incident light that has passed through the light inducing structure 295 may be more refracted toward the center of the light receiving element 220 by passing through the second high refractive pattern 241, so that the quantity of light received in the light receiving element 220 may be increased.

Figure 17:
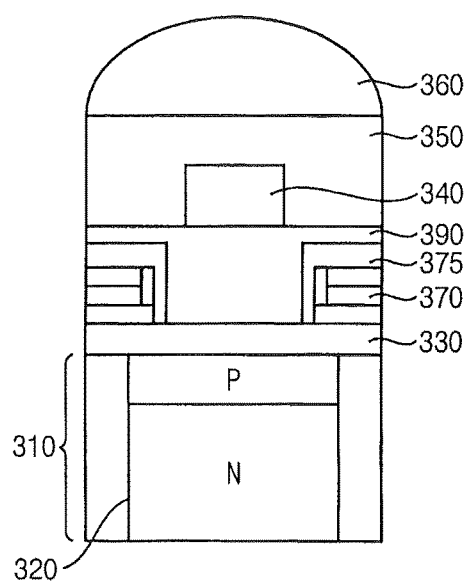

FIG. 17 is a sectional view illustrating an image sensor according to another example embodiment.

The image sensor 300 illustrated in FIG. 17 is a CCD (charge coupled device) image sensor.

One unit pixel is illustrated in FIG. 17 from among a plurality of unit pixels included in the image sensor 300.

Referring to FIG. 17, the image sensor 300 includes a light receiving element 320, an anti-reflection layer 330, a high refractive pattern 340, a color filter 350 and a micro lens 360.

As shown in FIG. 17, the light receiving element 320 is formed on a semiconductor substrate 310. The light receiving element 320 generates charges corresponding to the incident light. For instance, the light receiving element 320 illustrated in FIG. 17 is a photodiode.

The anti-reflection layer 330 is formed on the semiconductor substrate 310. The anti-reflection layer 330 prevents the incident light, which is incident through the micro lens 360, from being reflected so that quantity of light received in the light receiving element 320 may be increased.

A conductive pattern 370 serving as a wire is formed on the anti-reflection layer 330. In addition, a light shield structure 375 may be formed around the conductive pattern 370 to prevent the incident light from reaching the conductive pattern 370. The light shield structure 375 may include one of or a combination of tungsten (W), molybdenum (Mo), titanium (Ti), tungsten silicide (WSi), molybdenum silicide (MoSi), and titanium silicide (TiSi).

A first oxide layer 390 may be formed on the conductive pattern 370 and the light shield structure 375.

The high refractive pattern 340 is formed on the first oxide layer 390 in correspondence with the light receiving element 320. The high refractive pattern 340 may include a material having a high refraction coefficient. For instance, the high refractive pattern 340 may include one of or a combination of silicon nitride (SiN), titanium oxide ($TiO_2$), aluminum oxide ($Al_2O_3$), silicon oxynitride (SiON), aluminum nitride (AlN), tantalum oxide ($Ta_2O_3$), zirconium oxide ($ZrO_2$) and organic polymer.

The color filter 350 is formed on the first oxide layer 390 while covering a top surface and lateral sides of the high refractive pattern 340. The color filter 350 may allow light having a specific wavelength to pass therethrough. The color filter 350 may be included in a color filter array aligned in the form of a matrix. In one example embodiment, the color filter array may have a bayer pattern including a red filter, a green filter and a blue filter. That is, the color filter 350 may be one of the red filter, the green filter and the blue filter. In another example embodiment, the color filter array may include a yellow filter, a magenta filter and a cyan filter. That is, the color filter 350 may be one of the yellow filter, the magenta filter and the cyan filter. In addition, the color filter 350 may further include a white filter.

The micro lens 360 is formed on the color filter 350 in correspondence with the light receiving element 320. The micro lens 360 can adjust a path of the incident light such that the incident light introduced into the micro lens 360 can be concentrated onto the light receiving element 320. In addition, the micro lens 360 may be included in a micro lens array aligned in the form of a matrix.

The refractive index of the high refractive pattern 340 may be higher than that of the color filter 350. Thus, the incident light, which is incident through the micro lens 360, may be refracted to the center of the light receiving element 320 by passing through the high refractive pattern 340. Accordingly, the high refractive pattern 340 may increase the quantity of light received in the light receiving element 320.

In addition, as described above with reference to FIG. 1, because the high refractive pattern 340 is formed in the color filter 350, the thickness of the color filter 350 may be reduced so that the cross-talk may increase. To solve the above problem, the micro lens 360 formed on the color filter 350 may be prepared by using a material the same as that of the color filter 350. In this case, the micro lens 360 may perform the same function as that of the color filter 350, so that the effect of increasing the thickness of the color filter 350 may be realized, thereby reducing the cross-talk of the image sensor 300.

Figure 18:
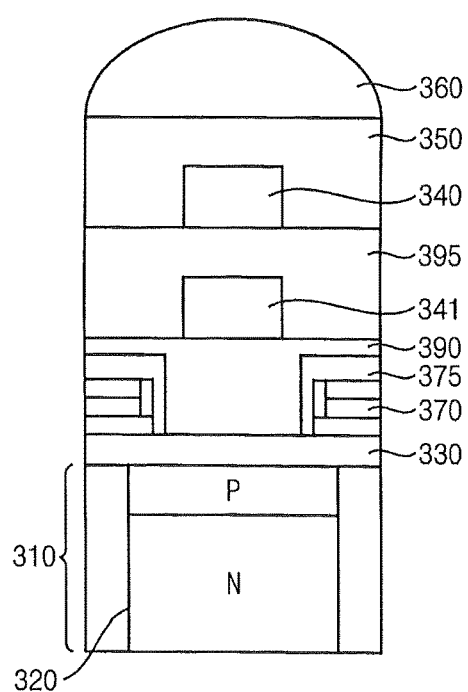

FIG. 18 is a sectional view illustrating an image sensor according to another example embodiment.

When compared with the image sensor 300 illustrated in FIG. 17, the image sensor 300a illustrated in FIG. 18 may further include a second oxide layer 395 formed between the first oxide layer 390 and the color filter 350 and a second high refractive pattern 341 formed in the second oxide layer 395.

The second high refractive pattern 341 may have a refractive index higher than that of the second oxide layer 395. Thus, the incident light that has passed through the high refractive pattern 340 may be more refracted toward the center of the light receiving element 320 by passing through the second high refractive pattern 341, so that the quantity of light received in the light receiving element 320 may be more increased.

Figure 19:
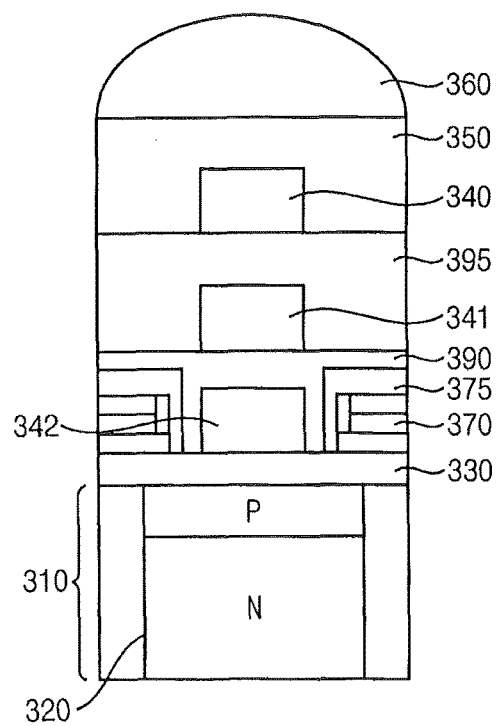

FIG. 19 is a sectional view illustrating an image sensor according to another example embodiment.

When compared with the image sensor 300a illustrated in FIG. 18, the image sensor 300b illustrated in FIG. 19 may further include a third high refractive pattern 342 formed in the first oxide layer 390.

The third high refractive pattern 342 may have a refractive index higher than that of the first oxide layer 390. Thus, the incident light that has passed through the high refractive pattern 340 and the second high refractive pattern 341 may be more refracted toward the center of the light receiving element 320 by passing through the third high refractive pattern 342, so that the quantity of light received in the light receiving element 320 in the image sensor 300b may be increased.

As described above with reference to FIGS. 1 to 19, the image sensors 100, 100a, 200, 200a, 300, 300a and 300b according to example embodiments include color filters provided therein with high refractive patterns having refractive indexes higher than refractive indexes of the color filters and the micro lens is formed by using a same material as that of the color filter, so quantity of light received in the light receiving element can be effectively increased without increasing the cross-talk even if the unit pixel has a small size. Thus, sensitivity of the image sensors according to example embodiments can be improved so that a high quality image can be provided.

Figure 20:
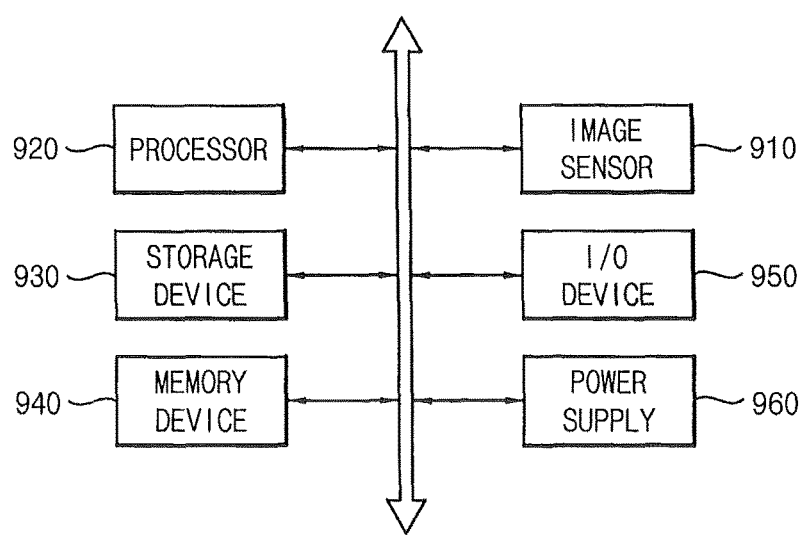
FIG. 20 is a block diagram illustrating a computing system including an image sensor according to an example embodiment.

FIG. 20 is a block diagram illustrating a computing system including an image sensor according to an example embodiment.

Referring to FIG. 20, a computing system 900 may include an image sensor 910, a processor 920 and a storage device 930.

The image sensor 910 may generate a digital signal corresponding to an incident light. The storage device 930 may store the digital signal. The processor 920 may control operations of the image sensor 910 and the storage device 930.

The computing system 900 may further include a memory device 940, an input/output device 950 and a power supply 960. Although it is not illustrated in FIG. 20, the computing system 900 may further include ports that communicate with a video card, a sound card, a memory card, a universal serial bus (USB) device, or other electronic devices.

The processor 920 may perform various calculations or tasks. According to some embodiments, the processor 920 may be a microprocessor or a CPU. The processor 920 may communicate with the storage device 930, the memory device 940 and the input/output device 950 via an address bus, a control bus, and/or a data bus. In some example embodiments, the processor 920 may be coupled to an extended bus, such as a peripheral component interconnection (PCI) bus.

The storage device 930 may include a non-volatile memory device, such as a flash memory device, a solid state drive (SSD), a hard disk drive (HDD), a compact disk read-only memory (CD-ROM) drive, etc.

The memory device 940 may store data used for operation of the electronic device 900. The memory device 940 may be a dynamic random access memory (DRAM), a static random access memory (SRAM), or a non-volatile memory, such as an erasable programmable read-only memory (EPROM), an electrically erasable programmable read-only memory (EEPROM), a flash memory, etc.

The input/output device 950 may include a keyboard, a mouse, a printer, a display device, etc. The power supply 960 may supply operational power.

The image sensor 910 may be connected to the processor 920 through one or more of the above buses or other communication links to communicate with the processor 920.

The image sensor 910 may include a color filter provided therein with a high refractive pattern having a refractive index higher than a refractive index of the color filter. Therefore, the image sensor 910 may effectively increase quantity of light received in a light receiving element although the unit pixel has a small size such that the image sensor 920 may provide an image having high quality.

The image sensor 910 may be embodied with one of the image sensors 100, 100a, 200, 200a, 300, 300a and 300b. A structure and operations of the image sensors 100, 100a, 200, 200a, 300, 300a and 300b are described above with reference to FIGS. 1 to 19. Therefore, a detail description of the image sensor 910 will be omitted.

The image sensor 910 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

According to example embodiments, the image sensor 910 may be integrated with the processor 920 in one chip, or the image sensor 910 and the processor 920 may be implemented as separate chips.

The computing system 900 may be any computing system using an image sensor. For example, the computing system 900 may include a digital camera, a mobile phone, a smart phone, a portable multimedia player (PMP), a personal digital assistant (PDA), etc.

FIG. 21 is a block diagram illustrating an example of an interface used in the computing system of FIG. 20.

Referring to FIG. 21, a computing system 1000 may be implemented by a data processing device (e.g., a cellular phone, a personal digital assistant, a portable multimedia player, a smart phone, etc.) that uses or supports a mobile industry processor interface (MIPI) interface. The computing system 1000 may include an application processor 1110, an image sensor 1140, a display device 1150, etc.

A CSI host 1112 of the application processor 1110 may perform a serial communication with a CSI device 1141 of the image sensor 1140 via a camera serial interface (CSI). In some embodiments, the CSI host 1112 may include a deserializer (DES), and the CSI device 1141 may include a serializer (SER). A DSI host 1111 of the application processor 1110 may perform serial communication with a DSI device 1151 of the display device 1150 via a display serial interface (DSI). In some example embodiments, the DSI host 1111 may include a serializer (SER), and the DSI device 1151 may include a deserializer (DES).

The computing system 1000 may further include a radio frequency (RF) chip 1160 performing communication with the application processor 1110. A physical layer (PHY) 1113 of the computing, system 1000 and a physical layer (PHY) 1161 of the RF chip 1160 may perform data communications based on a MIPI DigRF. The application processor 1110 may further include a DigRF MASTER 1114 that controls the data communications according to the MIPI DigRF of the PHY 1161, and the RF chip 1160 may further include a DigRF SLAVE 1162 controlled by the DigRF MASTER 1114.

The computing system 1000 may further include a global positioning system (GPS) 1120, a storage 1170, a MIC 1180, a DRAM device 1185, and a speaker 1190. In addition, the computing system 1000 may perform communications using an ultra wideband (UWB) 1210, a wireless local area network (WLAN) 1220, a worldwide interoperability for microwave access (WIMAX) 1230, etc. However, the structure and the interface of the computing system 1000 are not limited thereto.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An image sensor comprising:
a plurality of unit pixels, each of the plurality of unit pixels comprising:
a light receiving element formed on a semiconductor substrate to generate charges responsive to incident light;
an anti-reflection layer formed on the semiconductor substrate;
a high refractive pattern formed on the anti-reflection layer in correspondence with the light receiving element without being shared by an adjacent unit pixel, the high refractive pattern allowing the incident light to pass therethrough;
a color filter formed on the anti-reflection layer while covering all of a top surface and all of lateral sides of the high refractive pattern; and
a micro lens formed on the color filter,
wherein the high refractive pattern has a refractive index higher than a refractive index of the color filter.

2. The image sensor of claim 1, wherein the high refractive pattern comprises at least one of silicon nitride (SiN), titanium oxide (TiO$_2$), aluminum oxide (Al$_2$O$_3$), silicon oxynitride (SiON), aluminum nitride (AlN), tantalum oxide (Ta$_2$O$_3$), zirconium oxide (ZrO$_2$) and organic polymer.

3. The image sensor of claim 1, wherein the micro lens and the color filter comprise a same material.

4. The image sensor of claim 1, further comprising a conductive pattern formed under the semiconductor substrate.

5. The image sensor of claim 1, further comprising a conductive pattern formed between the anti-reflection layer and the color filter.

6. The image sensor of claim 5, further comprising:
an oxide layer formed between the anti-reflection layer and the conductive patter; and
a light inducing structure that extends through the conductive pattern to make contact with the oxide layer.

7. The image sensor of claim 6, further comprising a second high refractive pattern positioned under the light inducing structure and formed in the oxide layer.

8. The image sensor of claim 7, wherein the second high refractive pattern has a refractive index higher than a refractive index of the oxide layer.

9. The image sensor of claim 5, further comprising:
an oxide layer formed between the conducive pattern and the color filter; and
a second high refractive pattern formed in the oxide layer.

10. The image sensor of claim 9, wherein the second high refractive pattern has a refractive index higher than a refractive index of the oxide layer.

11. An image sensor comprising:
a plurality of light receiving elements formed on a semiconductor substrate to generate charges responsive to incident light;
an anti-reflection layer formed on the semiconductor substrate;
a plurality of high refractive patterns formed on the anti-reflection layer in correspondence with first light receiving elements of the plural light receiving elements;
a plurality of first color filters formed on the anti-reflection layer while covering all of a top surface and all of lateral sides of each high refractive pattern in correspondence with the first light receiving elements, respectively, to selectively allow light having a first color to pass therethrough;
a plurality of second color filters formed on the anti-reflection layer in correspondence with second light receiving elements of the plural light receiving elements, respectively, to selectively allow light having a color different from the first color to pass therethrough; and
a plurality of micro lenses formed on the first and second color filters, respectively,
wherein the high refractive patterns have a refractive index higher than a refractive index of the first color filters,
wherein the image sensor includes a plurality of unit pixels, and each of the plurality of unit pixels includes a respective high refractive pattern without sharing the respective high refractive pattern with an adjacent unit pixel, and
wherein the plurality of high refractive patterns allow the incident light to pass therethrough.

12. The image sensor of claim 11, wherein the micro lenses formed on the first color filters and the first color filters comprise a same material.

13. The image sensor of claim 11, wherein the first color is blue.

14. An image sensor comprising:
a plurality of unit pixels, each of the plurality of unit pixels comprising:
a light receiving element formed on a semiconductor substrate and configured to generate charges responsive to incident light;
a high refractive pattern formed on the light receiving element without being shared by an adjacent unit pixel, the high refractive pattern allowing the incident light to pass therethrough;
a color filter formed on all of a top surface and all of lateral sides of the high refractive pattern; and
a micro lens formed on the color filter;
wherein a refractive index of the high refractive pattern is higher than a refractive index of the color filter.

15. The image sensor of claim 14, further comprising:
an anti-reflection layer disposed between the high refractive pattern and the light receiving element.

16. The image sensor of claim 14, wherein the color filter and the micro lens comprise a same material.

17. The image sensor of claim 14, further comprising:
a conductive pattern disposed on a side of the semiconductor substrate opposite the high refractive pattern.

18. The image sensor of claim 14, wherein the high refractive pattern comprises at least one of silicon nitride (SiN), titanium oxide (TiO$_2$), aluminum oxide (Al$_2$O$_3$), silicon oxynitride (SiON), aluminum nitride (AlN), tantalum oxide (Ta$_2$O$_3$), zirconium oxide (ZrO$_2$) and organic polymer.

* * * * *